(12) United States Patent
    Eo

(10) Patent No.: US 10,680,198 B2
(45) Date of Patent: Jun. 9, 2020

(54) DISPLAY DEVICE AND METHOD OF MANUFACTURING THE SAME

(71) Applicant: Samsung Display Co., Ltd., Yongin-si, Gyeonggi-Do (KR)

(72) Inventor: Sung Woo Eo, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/162,316

(22) Filed: Oct. 16, 2018

(65) Prior Publication Data

US 2019/0173050 A1    Jun. 6, 2019

(30) Foreign Application Priority Data

Dec. 4, 2017 (KR) ................ 10-2017-0164970

(51) Int. Cl.
| | |
|---|---|
| *H01L 51/52* | (2006.01) |
| *H05K 5/00* | (2006.01) |
| *H05K 5/03* | (2006.01) |
| *H01L 51/56* | (2006.01) |
| *H01L 27/32* | (2006.01) |
| *G02B 5/30* | (2006.01) |

(52) U.S. Cl.
CPC ...... *H01L 51/5246* (2013.01); *H01L 51/5253* (2013.01); *H01L 51/5281* (2013.01); *H01L 51/5284* (2013.01); *H01L 51/56* (2013.01); *H05K 5/0017* (2013.01); *H05K 5/03* (2013.01); *G02B 5/30* (2013.01); *H01L 27/323* (2013.01); *H01L 27/3244* (2013.01); *H01L 2251/5338* (2013.01); *H01L 2251/556* (2013.01); *H01L 2251/558* (2013.01)

(58) Field of Classification Search
CPC . H01L 51/5246; H01L 51/56; H01L 51/5281; H01L 51/5253; H01L 27/3244; H01L 27/323; H05K 5/0017; H05K 5/03
See application file for complete search history.

(56) References Cited

U.S. PATENT DOCUMENTS

| | | | | |
|---|---|---|---|---|
| 8,896,900 | B2 * | 11/2014 | Park .................... | G02B 5/23 |
| | | | | 359/242 |
| 2007/0176553 | A1 * | 8/2007 | Kwak ................... | C03C 8/24 |
| | | | | 313/512 |
| 2015/0189717 | A1 * | 7/2015 | Kuranaga .......... | H01L 51/5246 |
| | | | | 313/511 |

FOREIGN PATENT DOCUMENTS

| | | |
|---|---|---|
| JP | 2016-102050 A | 6/2016 |
| KR | 10-2012-0026098 A | 3/2012 |
| KR | 10-2012-0030412 A | 3/2012 |
| KR | 10-1298236 B1 | 8/2013 |

* cited by examiner

*Primary Examiner* — Hsien Ming Lee
(74) *Attorney, Agent, or Firm* — Innovation Counsel LLP

(57) ABSTRACT

A display device includes a display panel having a display region and a non-display region that is arranged outside the display region, a cover window arranged on the display panel, and a frit coating layer formed on a side surface of the cover window.

20 Claims, 11 Drawing Sheets

DISPLAY DEVICE AND METHOD OF MANUFACTURING THE SAME

This application claims priority from Korean Patent Application No. 10-2017-0164970 filed on Dec. 4, 2017 in the Korean Intellectual Property Office, the disclosure of which is incorporated herein by reference in its entirety.

BACKGROUND

1. Field of the Disclosure

The present disclosure relates to a display device and a method of manufacturing the same.

2. Description of the Related Art

Display devices are becoming increasingly important with the development and wide-spread of information technology, and various display devices, such as a liquid-crystal display (LCD), an organic light-emitting diode (OLED) display, and the like, are being developed.

Among the display devices, OLED displays are being focused on as one of the next generation display devices due to their wide viewing angles, excellent contrast, and fast response speed.

Some OLED displays may have flexibility. Such flexible display devices may have a flat display region and a curved display region, and research has been actively conducted on a cover window including a curved surface to correspond to the flat display region and the curved display region.

SUMMARY

Aspects of the present disclosure provide a display device capable of preventing light leakage using a frit coating layer.

Aspects of the present disclosure also provide a method of manufacturing a display device in which a process is simplified.

It should be noted that objects of the present disclosure are not limited to the above-described objects, and other objects of the present disclosure will be apparent to those skilled in the art from the following descriptions.

One aspect of the present disclosure provides a display device including a display panel having a display region and a non-display region that is arranged outside the display region, a cover window arranged on the display panel, and a frit coating layer formed on a side surface of the cover window.

Further, the cover window may include a flat portion and a curved portion that is arranged at both sides of the flat portion, the side surface of the cover window may include a left side surface and a right side surface formed at ends of the curved portion, and the frit coating layer may be formed on the left side surface and the right side surface.

Further, the display device may further include an upper side surface and a lower side surface configured to connect upper ends and lower ends of the left side surface and the right side surface, wherein the frit coating layer may be formed on the left side surface, the right side surface, the upper side surface, and the lower side surface.

Further, the display panel may include a first substrate, an encapsulation layer formed on the first substrate, and an organic light-emitting diode arranged between the first substrate and the encapsulation layer.

Further, a thickness of the frit coating layer may range from 5 μm to 15 μm.

Further, the side surface may include a polished surface chamfered in an oblique direction.

Further, the display device may further include an input sensing unit arranged between the display panel and the cover window.

Further, the display device may further include a polarizing layer arranged between the display panel and the cover window.

Further, the display device may further include a printing layer arranged between the display panel and the cover window.

Further, the frit coating layer may be black.

Further, the cover window may be flat.

Further, the display panel may include a first substrate, a second substrate opposite to the first substrate, and an organic light-emitting diode arranged between the first substrate and the second substrate.

Further, the cover window and the frit coating layer may be made of glass.

Further, the cover window and the frit coating layer may have the same coefficient of thermal expansion.

Another aspect of the present disclosure provides a method of manufacturing a display device including applying a frit onto a side surface of a cover window, pressing the cover window with an upper jig and a lower jig and forming a curved portion, and applying heat to the frit and forming a frit coating layer.

Further, a temperature of the heat applied to the frit may range from 400° C. to 900° C.

Further, the upper jig and the lower jig may include graphite.

Further, the cover window may include a flat portion and a curved portion that is arranged at both sides of the flat portion, the side surface of the cover window may include a left side surface and a right side surface formed at ends of the curved portion, and the applying of the frit onto the side surface of the cover window may include applying a frit onto the left side surface and the right side surface.

Further, the applying of the frit onto the side surface of the cover window may include printing the frit in a solution state onto the side surface of the cover window.

Details of exemplary embodiments are included in the detailed description and the drawings.

BRIEF DESCRIPTION OF THE DRAWINGS

The advantages and features of the present disclosure and methods for achieving the advantages and features will be apparent by referring to the embodiments to be described in detail with reference to the accompanying drawings. However, the present disclosure is not limited to the embodiments disclosed hereinafter but can be implemented in diverse forms. The matters defined in the description, such as the detailed construction and elements, are nothing but specific details provided to assist those of ordinary skill in the art in a comprehensive understanding of the present disclosure.

Where an element is described as being related to another element such as being "on" another element or "located on" a different element or layer, includes both a case where the element is located directly on another element or layer and a case where the element is located on another element or layer via yet another element or layer. In contrast, where an element is described as being is related to another element such as being "directly on" another element or "located directly on" a different element or layer, indicates a case where the element is located on another element or layer with no intervening element or layer therebetween. In the entire description of the present disclosure, the same drawing reference numerals are used for the same elements across various figures.

Figure 1:
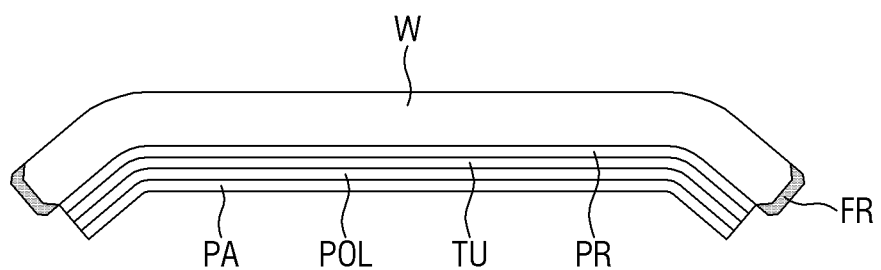

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on a "lower" side of other elements would then be oriented on an "upper" side of the other elements. The exemplary term "lower" can therefore encompass both an orientation of "lower" and "upper," depending on the particular orientation of the figure. Similarly, if the device in one of the figures is turned over, elements described as "below" or "beneath" other elements would then be oriented "above" or "over" the other elements. The exemplary terms "below" or "beneath" can therefore encompass both an orientation of above and below.

"About" or "approximately" as used herein is inclusive of the stated value and means within an acceptable range of deviation for the particular value as determined by one of ordinary skill in the art, considering the measurement in question and an error associated with measurement of the particular quantity (i.e., the limitations of a measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature, and their shapes are not intended to illustrate the precise shape of a region and are not intended to limit the scope of the present disclosure.

Figure 2:
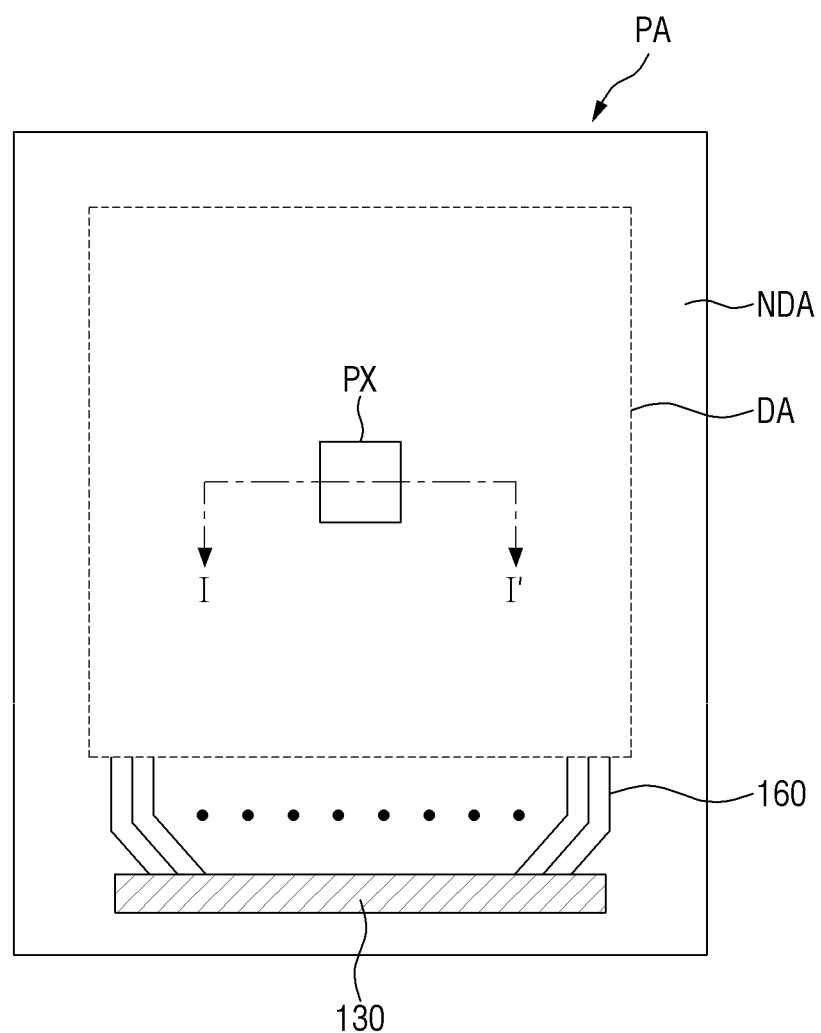
Figure 3:
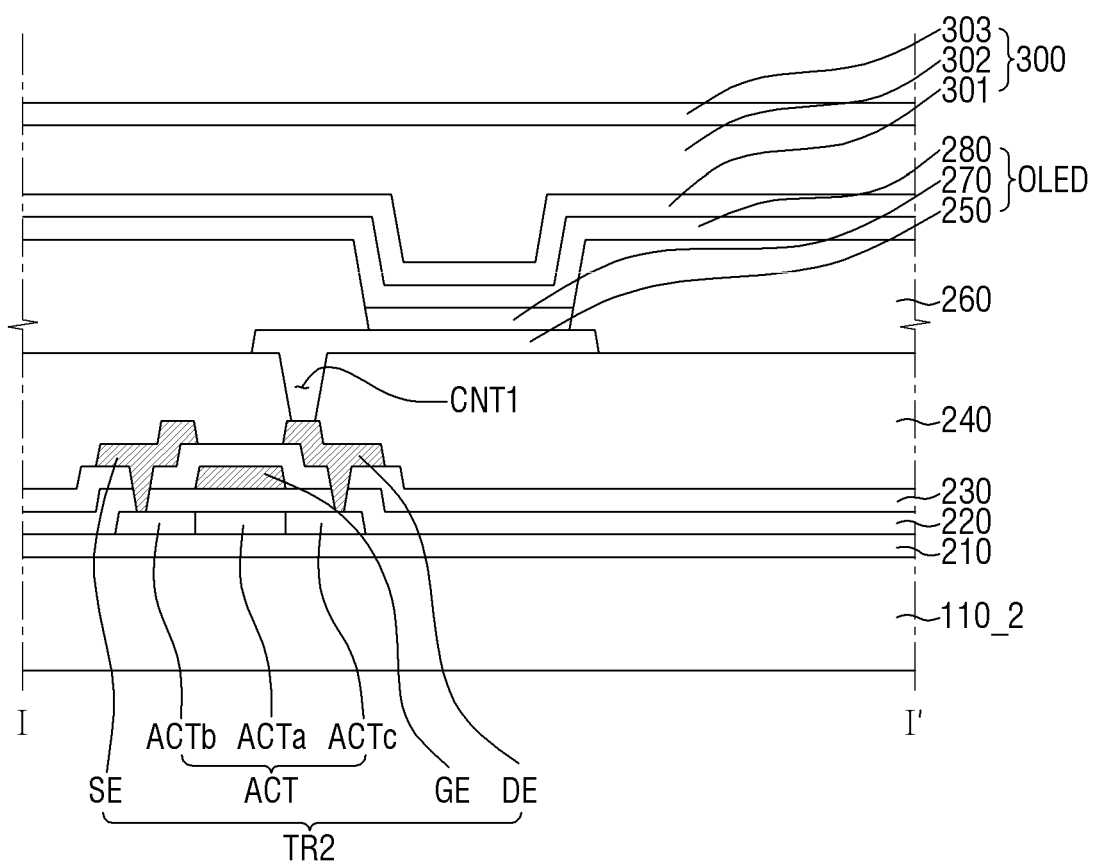
Figure 4:
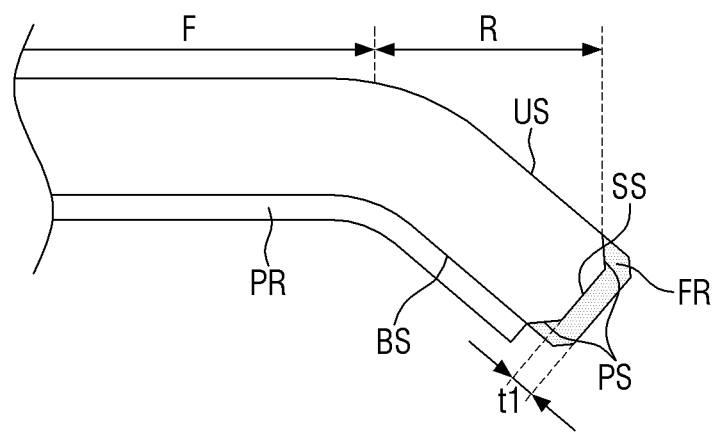
Figure 5:
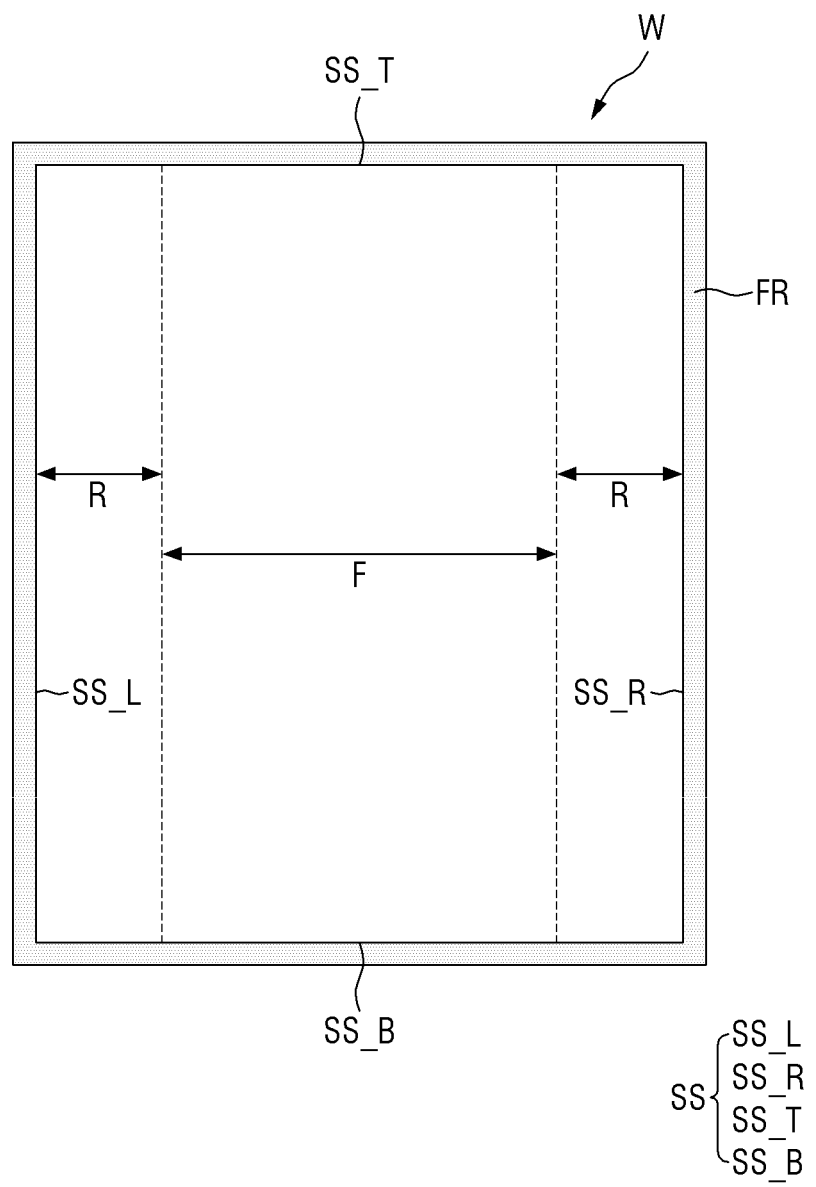
Figure 6:
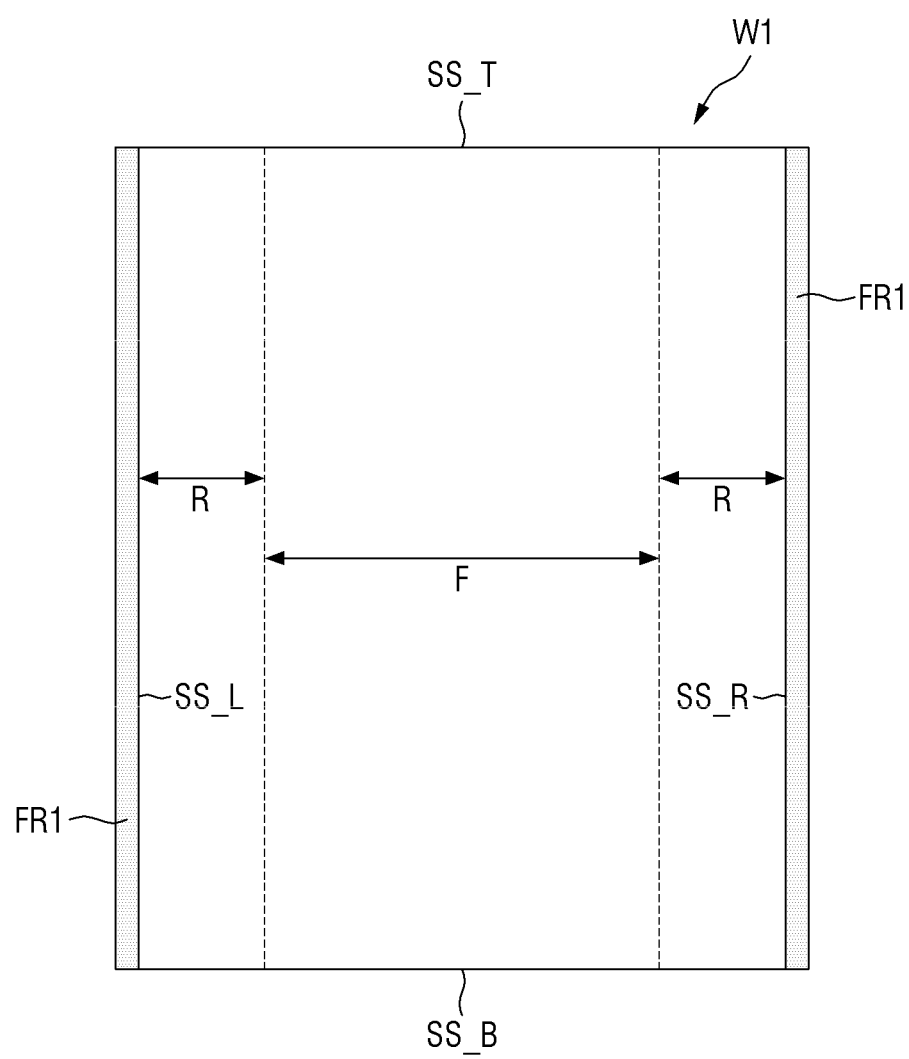
Figure 7:
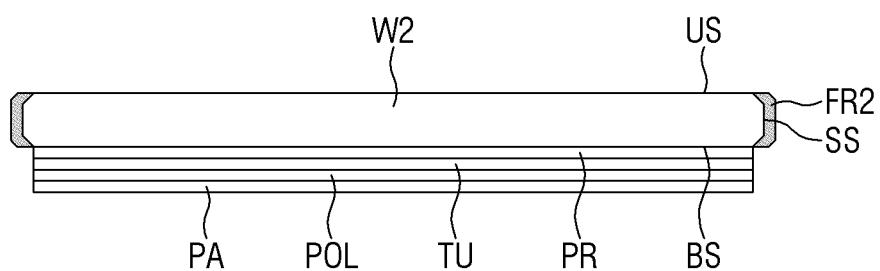
Figure 8:
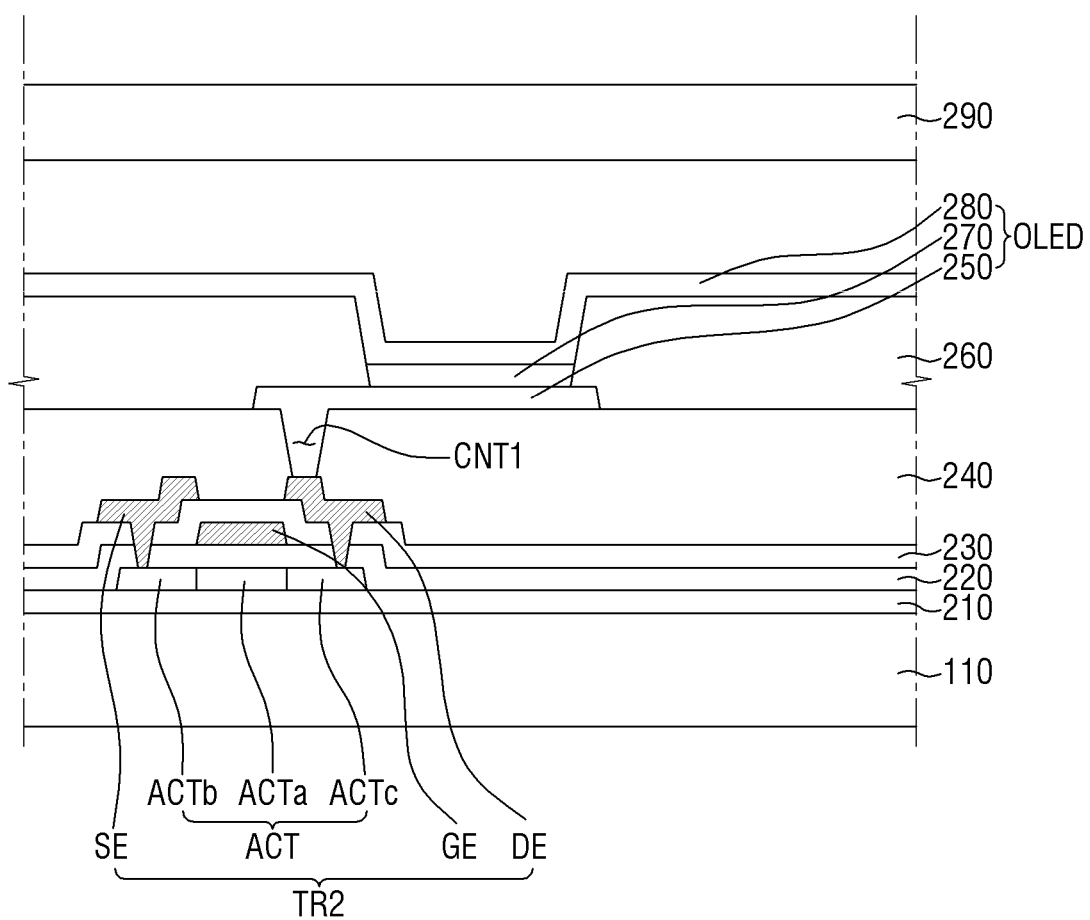
Figure 9:
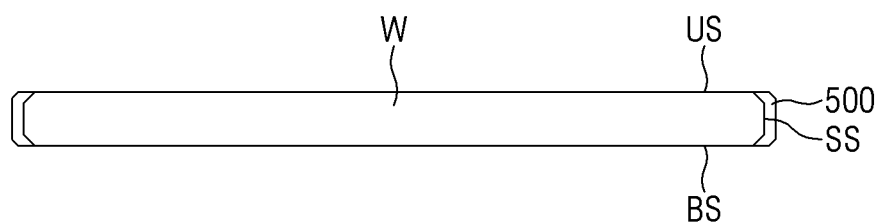
Figure 10:
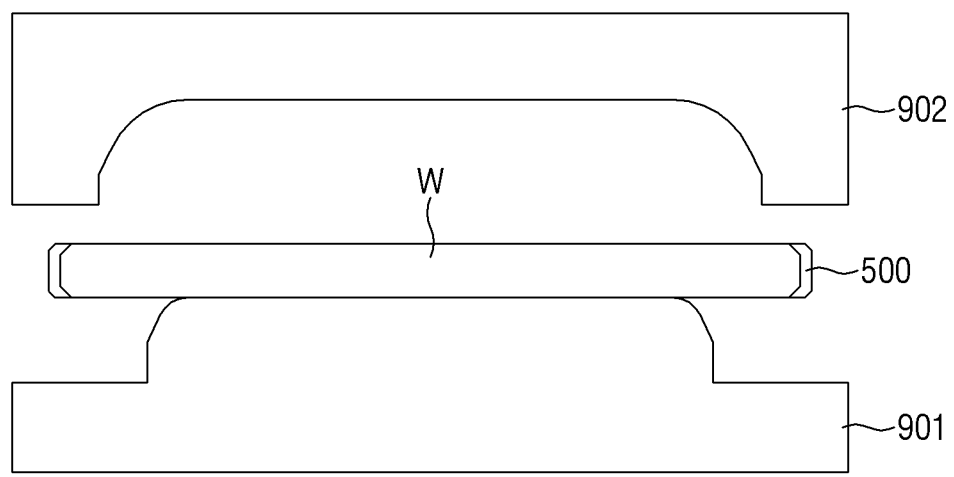
Figure 11:
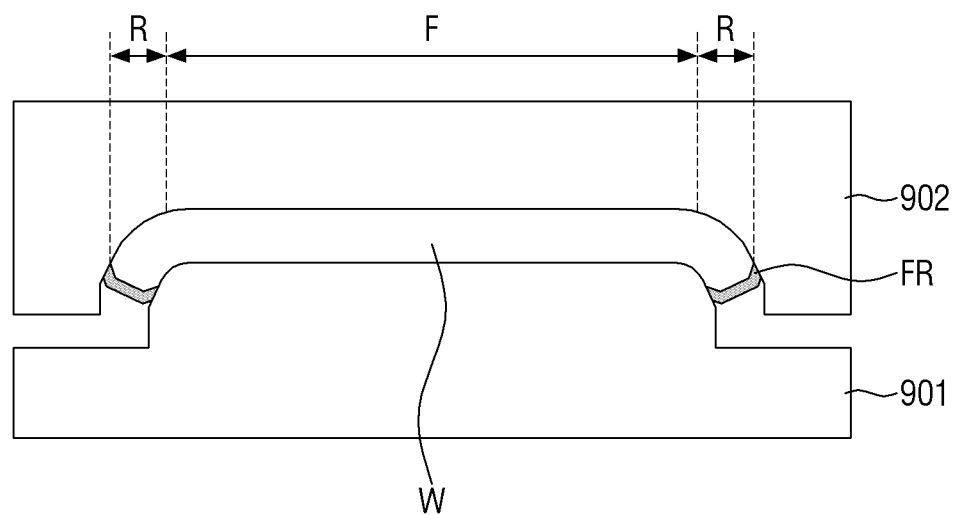

The above and other aspects and features of the present disclosure will become more apparent by describing exemplary embodiments thereof in detail with reference to the attached drawings, in which:

FIG. 1 is a cross-sectional view of a display device according to an exemplary embodiment of the present disclosure;

FIG. 2 is a partial layout diagram of the display device according to the exemplary embodiment of FIG. 1;

FIG. 3 is a cross-sectional view taken along line I-I' of FIG. 2;

FIG. 4 is a partial cross-sectional view of the display device according to the exemplary embodiment of FIG. 1;

FIG. 5 is a partial plan view of the display device according to the exemplary embodiment of FIG. 1;

FIG. 6 is a partial plan view of a display device according to another exemplary embodiment of the present disclosure;

FIG. 7 is a cross-sectional view of the display device according to another embodiment of the present disclosure;

FIG. 8 is a cross-sectional view of the display device according to another embodiment of the present disclosure;

FIG. 9 is a cross-sectional view for describing a method of manufacturing a display device according to an exemplary embodiment of the present disclosure;

FIG. 10 is a cross-sectional view for describing the method of manufacturing a display device according to an exemplary embodiment of the present disclosure; and FIG. 11 is a cross-sectional view for describing the method of manufacturing a display device according to an exemplary embodiment of the present disclosure.

DETAILED DESCRIPTION OF THE EMBODIMENTS

FIG. 1 is a cross-sectional view of a display device according to an exemplary embodiment of the present disclosure. FIG. 2 is a partial layout diagram of the display device according to the exemplary embodiment of FIG. 1. FIG. 3 is a cross-sectional view taken along line I-I' of FIG. 2. FIG. 4 is a partial cross-sectional view of the display device according to the exemplary embodiment of FIG. 1. FIG. 5 is a partial plan view of the display device according to the exemplary embodiment of FIG. 1.

Referring to FIGS. 1 to 5, the display device according to the exemplary embodiment of the present disclosure includes a display panel PA, a cover window W arranged on the display panel PA, and a frit coating layer FR formed on a side surface of the cover window W.

The display panel PA will be described with reference to FIGS. 2 and 3.

Referring to FIG. 2, the display panel PA may display an image. In an exemplary embodiment, the display panel PA may be an organic light-emitting diode (OLED) display. The OLED display will be described below in detail. In an exemplary embodiment, the display panel PA may be a flexible display panel that can be bent, folded, or scrolled.

The display panel PA may include a display region DA and a non-display region NDA arranged outside the display region DA.

The display region DA may be a region for displaying an image. A plurality of pixels PX may be arranged in the display region DA. Next, a stacked structure of the pixel PX will be described with reference to FIG. 3.

In an exemplary embodiment, the display panel PA may include a first substrate 110_2. In an exemplary embodiment, the first substrate 110_2 may include a material such as glass, quartz, a polymer resin, or the like. Here, the polymer material of the polymer resin may be polyethersulphone (PES), polyacrylate (PA), polyarylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or a combination thereof.

A buffer layer 210 may be arranged on the first substrate 110_2. The buffer layer 210 may prevent moisture and oxygen from penetrating from the outside through the first substrate 110_2. Further, the buffer layer 210 may planarize a surface of the first substrate 110_2. In an exemplary embodiment, the buffer layer 210 may include any one of a silicon nitride ($SiN_x$) film, a silicon oxide ($SiO_2$) film, and a silicon oxynitride ($SiO_xN_y$) film. The buffer layer 210 may be omitted according to a type of the first substrate 110_2, process methods and conditions, or the like.

A semiconductor layer including a semiconductor pattern ACT may be arranged on the buffer layer 210. The semiconductor layer will be described on the basis of the semiconductor pattern ACT. In an exemplary embodiment, the semiconductor pattern ACT may be formed to include at least one material selected from a group consisting of polycrystalline silicon, monocrystalline silicon, low temperature polycrystalline silicon, amorphous silicon, and an oxide semiconductor. In an exemplary embodiment, the semiconductor pattern ACT may include a channel region ACTa that is not doped with an impurity and may include a source region ACTb and a drain region ACTc that are doped with an impurity. The source region ACTb is located at one side of the channel region ACTa and is electrically connected to a source electrode SE to be described below. The drain region ACTc is located at the other side of the channel region ACTa and is electrically connected to a drain electrode DE to be described below.

A first insulating layer 220 may be arranged on the semiconductor layer that includes the semiconductor pattern ACT. In an exemplary embodiment, the first insulating layer 220 may be a gate insulating layer. In an exemplary embodiment, the first insulating layer 220 may be formed to include at least one material selected from a group consisting of inorganic insulating materials, such as silicon oxide ($SiO_x$), silicon nitride ($SiN_x$), and the like, and organic insulating materials such as benzocyclobutene (BCB), acrylic materials, and polyimide.

A gate conductor including a gate electrode GE may be arranged on the first insulating layer 220. The gate electrode GE may overlap at least a portion of the semiconductor pattern ACT. The gate conductor may include at least one of an aluminum (Al)-based metal including an aluminum alloy, a silver (Ag)-based metal including a silver alloy, a copper (Cu)-based metal including a copper alloy, a molybdenum (Mo)-based metal including a molybdenum alloy, chromium (Cr), titanium (Ti), and tantalum (Ta).

A second insulating layer 230 may be arranged on the gate conductor that includes the gate electrode GE. The second insulating layer 230 may be formed to include at least one material selected from a group consisting of inorganic insulating materials, such as silicon oxide ($SiO_x$), silicon nitride ($SiN_x$), and the like, and organic insulating materials such as BCB, acrylic materials, and polyimide.

A data conductor including a source electrode SE and a drain electrode DE may be arranged on the second insulating layer 230. The source electrode SE and the drain electrode DE are spaced apart from each other on the second insulating layer 230. The data conductor may include at least one material selected from a group consisting of a metal, an alloy, a metal nitride, a conductive metal oxide, and a transparent conductive material. In an exemplary embodiment, the data conductor may have a single-layer or multi-layer structure made of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), or the like. In addition, an alloy formed by adding at least one element selected from a group consisting of titanium (Ti), zirconium (Zr), tungsten (W), tantalum (Ta), niobium (Nb), platinum (Pt), hafnium (Hf), oxygen (O), and nitrogen (N) to the metal may be used as a material of the source electrode SE and the drain electrode DE.

The semiconductor pattern ACT, the gate electrode GE, the source electrode SE, and the drain electrode DE described above constitute a switching element TR2. Although the switching element TR2 is illustrated as being formed in a top gate manner in FIG. 3, the present disclosure is not limited thereto. That is, the switching element TR2 may be formed in a bottom gate manner.

A planarization layer 240 may be arranged on the data conductor. The planarization layer 240 may planarize a level difference caused by the switching element TR2 and the second insulating layer 230 to increase light-emitting efficiency of a pixel electrode 250 and an organic light-emitting layer 270, which will be described below. In an exemplary embodiment, the planarization layer 240 may include an organic material. For example, the planarization layer 240 may include at least one selected from a group consisting of polyimide, polyacryl, and polysiloxane. In another exemplary embodiment, the planarization layer 240 may include an inorganic material, or may include a composite of an inorganic material and an organic material. A first contact hole CNT1 that exposes at least a part of the drain electrode DE may be formed in the planarization layer 240.

The pixel electrode 250 may be arranged on the planarization layer 240. The pixel electrode 250 may be electrically connected to the drain electrode DE that is exposed by the first contact hole CNT1. The pixel electrode 250 may be an anode that is a hole injection electrode. When the pixel electrode 250 is an anode, the pixel electrode 250 may include a material having a high work function to facilitate hole injection. Alternatively, in an exemplary embodiment, the pixel electrode 250 may be a reflective electrode, a transflective electrode, or a transmissive electrode. In an exemplary embodiment, the pixel electrode 250 may include a reflective material. In an exemplary embodiment, the reflective material may include at least one selected from a group consisting of silver (Ag), magnesium (Mg), chromium (Cr), gold (Au), platinum (Pt), nickel (Ni), copper (Cu), tungsten Al), aluminum-lithium (Al—Li), magnesium-indium (Mg—In), and magnesium-silver (Mg—Ag).

In an exemplary embodiment, the pixel electrode 250 may be formed as a single layer, but the present disclosure is not limited thereto. That is, the pixel electrode 250 may be formed as multiple layers in which two or more layers having dissimilar materials are stacked.

In an exemplary embodiment, when the pixel electrode 250 is formed as multiple layers, the pixel electrode 250 may include a reflective film and a transparent or translucent electrode arranged on the reflective film. In another exemplary embodiment, the pixel electrode 250 may include a reflective film and a transparent or translucent electrode that is arranged below the reflective film. For example, the pixel electrode 250 may have a three-layer structure of ITO/Ag/ITO, but the present disclosure is not limited thereto.

Here, the transparent or translucent electrode may include at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

A pixel defining film 260 may be arranged on the pixel electrode 250 and the planarization layer 240. The pixel defining film 260 includes an opening that exposes at least a part of the pixel electrode 250. The pixel defining film 260 may include an organic material or an inorganic material. In an exemplary embodiment, the pixel defining film 260 may include a material such as a photoresist, a polyimide resin, an acrylic resin, a silicon compound, a polyacrylic resin, or the like.

The organic light-emitting layer 270 may be arranged on the pixel electrode 250 and the pixel defining film 260. More particularly, the organic light-emitting layer 270 may be arranged on a region of the pixel electrode 250 that is exposed through the opening of the pixel defining film 260. In an exemplary embodiment, the organic light-emitting layer 270 may cover at least a part of a sidewall of the pixel defining film 260.

In an exemplary embodiment, the organic light-emitting layer 270 may emit light of one of red, blue, and green colors. In another exemplary embodiment, the organic light-emitting layer 270 may emit white light, or may emit light of one of cyan, magenta, and yellow colors. When the organic light-emitting layer 270 emits white light, the organic light-emitting layer 270 may include a white light-emitting material or may have a stacked structure, in which one or more light-emitting layers are stacked, for example, a red light-emitting layer, a green light-emitting layer, and a blue light-emitting layer.

A common electrode 280 may be arranged on the organic light-emitting layer 270 and the pixel defining film 260. In an exemplary embodiment, the common electrode 280 may entirely cover the organic light-emitting layer 270 and the pixel defining film 260. In an exemplary embodiment, the common electrode 280 may be a cathode. In an exemplary embodiment, the common electrode 280 may include at least one selected from a group consisting of Li, Ca, LiF/Ca, LiF/Al, Al, Ag, and Mg. Further, the common electrode 280 may be made of a material having a low work function. In an exemplary embodiment, the common electrode 280 may be a transparent or translucent electrode including at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode 250, the organic light-emitting layer 270, and the common electrode 280 described above may constitute an OLED. However, the present disclosure is not limited thereto, and the OLED may have a multi-layer structure further including a hole injection layer (HIL), a hole transport layer (HTL), an electron transport layer (ETL), and an electron injection layer (EIL).

An encapsulation layer 300 may be formed on the common electrode 280 of the first substrate 110_2.

The encapsulation layer 300 may prevent penetration of impurities such as water and air that may be introduced from the outside into the OLED. In an exemplary embodiment, the encapsulation layer 300 may include a first inorganic layer 301, an organic layer 302, and a second inorganic layer 303.

The first inorganic layer 301 may be arranged on the common electrode 280. The first inorganic layer 301 may include at least one selected from a group consisting of silicon oxide ($SiO_x$), silicon nitride ($SiN_x$), and silicon oxynitride ($SiON_x$).

The organic layer 302 may be arranged on the first inorganic layer 301. The organic layer 302 may include any one selected from a group consisting of epoxy, acrylate, and urethane acrylate. The organic layer 302 may planarize a level difference caused by the pixel defining film 260.

The second inorganic layer 303 may be arranged on the organic layer 302. The second inorganic layer 303 may include at least one selected from a group consisting of silicon oxide ($SiO_x$), silicon nitride ($SiN_x$), and silicon oxynitride ($SiON_x$).

Meanwhile, in FIG. 3, each of the first inorganic layer 301, the organic layer 302, and the second inorganic layer 303 is illustrated as being a single layer, but the present disclosure is not limited thereto. For example, at least one layer of the first inorganic layer 301, the organic layer 302, and the second inorganic layer 303 may be formed to have a multi-layer structure.

In another exemplary embodiment, the encapsulation layer 300 may include a hexamethyldisiloxane (HMDSO) layer. More particularly, the encapsulation layer 300 may include a first inorganic layer 301, a second inorganic layer 303, and an HMDSO layer (not shown) that is arranged between the first inorganic layer 301 and the second inorganic layer 303. That is, the above-described organic layer 302 may be replaced by the HMDSO layer.

In an exemplary embodiment, the HMDSO layer may be formed in the same chamber after the first inorganic layer 301 is formed. Accordingly, a process of forming the encapsulation layer 300 may be simplified. Because the HMDSO layer is capable of absorbing stress, the encapsulation layer 300 including the HMDSO layer may have sufficient flexibility.

Referring again to FIG. 2, the non-display region NDA may be arranged outside the display region DA. Various signal lines that are necessary for the display region DA to display an image may be arranged in the non-display region NDA.

The non-display region NDA corresponds to a region that is arranged outside the display region DA and does not display an image. In an exemplary embodiment, the non-display region NDA may be arranged to surround the display region DA. In FIG. 2, the non-display region NDA is illustrated as surrounding the display region DA, but the present disclosure is not limited thereto. In another exemplary embodiment, the non-display region NDA may be arranged to be adjacent to one or more sides of the display region DA, or may be arranged to be adjacent to only one side or both sides of the display region DA with respect to the display region DA.

In an exemplary embodiment, a driving integrated circuit 130 may be arranged in the non-display region NDA. The driving integrated circuit 130 may generate signals to drive various components of the display panel PA in the display region DA.

A plurality of conductive lines 160 may be arranged between the driving integrated circuit 130 and the display region DA. The plurality of conductive lines 160 may electrically connect the driving integrated circuit 130 to the display region DA. That is, signals that are generated by the driving integrated circuit 130 may be transmitted to the display region DA through the plurality of conductive lines 160.

Referring again to FIG. 1, a polarizing layer POL may be arranged on the display panel PA. The polarizing layer POL may reduce reflectivity of light incident from the outside. In an exemplary embodiment, the polarizing layer POL may include a retarder and a polarizer.

In another exemplary embodiment, the polarizing layer POL may be omitted. When the polarizing layer POL is omitted, a black matrix and a color filter may be arranged in the display panel PA to prevent color separation due to external light reflection.

An input sensing layer TU may be arranged on the polarizing layer POL. In a case where the polarizing layer POL is omitted, the input sensing layer TU may be arranged on the display panel PA. The input sensing layer TU may register an external touch and generate a corresponding signal.

A printing layer PR may be arranged on the input sensing layer TU. The cover window W may at least partially cover the printing layer PR.

The printing layer PR may serve to block light leakage. In an exemplary embodiment, the printing layer PR may be a decorative printing layer. Accordingly, the printing layer PR may include a black pigment or a colored pigment.

FIG. 1 illustrates the case in which the printing layer PR is formed as a single layer, but the present disclosure is not limited thereto. In another exemplary embodiment, the printing layer PR may have a stacked structure in which one or more functional layers are stacked.

In an exemplary embodiment, the printing layer PR may include a decorative film (not illustrated).

The cover window W may be arranged on the printing layer PR. In an exemplary embodiment, the cover window W may be made of glass or plastic. However, the present disclosure is not limited thereto, and any transparent material may be used for forming the cover window W according to the exemplary embodiment of the present disclosure.

In an exemplary embodiment, the cover window W may be curved. The curved cover window W will be described in detail with reference to FIG. 4.

Referring to FIG. 4, the cover window W may include a flat portion F and curved portions R arranged at both ends of the flat portion F.

The flat portion F corresponds to a flat surface of the cover window W and may be formed to be transparent. An image generated by the display panel PA may be provided to a user through the flat portion F.

The curved portion R may be bent with a predetermined curvature. The curved portion R may extend from the flat portion F. In an exemplary embodiment, the curved portion R may be integrally formed with the flat portion F.

The cover window W may include an upper surface US, a lower surface BS, and side surfaces SS.

The upper surface US and the lower surface BS may be opposite to each other. An image generated by the display panel PA may be provided to the user through the lower surface BS and the upper surface US.

The side surface SS may correspond to a surface that connects ends of the upper surface US and the lower surface BS. In an exemplary embodiment, the side surface SS may include polished surfaces PS. In other words, as illustrated in FIGS. 4 and 5, the side surface SS may include the polished surfaces PS that are chamfered in an oblique direction.

The frit coating layer FR may be arranged on the side surface SS of the cover window W. In an exemplary embodiment, the frit coating layer FR may be made by sintering a frit. That is, the frit coating layer FR may include a frit made of a glass material.

In an exemplary embodiment, the frit coating layer FR may be black. Some of light generated in the display region DA may be transmitted toward the side surface SS of the cover window W. When the light exits the side surface SS of the cover window W, a light leakage phenomenon may occur. When the frit coating layer FR is black, the frit coating layer FR may absorb and block the light leaking through the side surface SS.

In an exemplary embodiment, the frit coating layer FR may have a first thickness t1. In an exemplary embodiment, the first thickness t1 may range from 5 μm to 15 μm.

When the frit coating layer FR is formed on the side surface SS of the cover window W, the frit coating layer FR may prevent light traveling toward the side surface SS from leaking through the side surface SS.

Further, in an exemplary embodiment, in the case in which the cover window W is made of glass, when a crack is formed on the side surface SS, such a crack may grow toward the center of the cover window W and be visible.

As described above, the frit coating layer FR may include a glass material and may prevent a crack from being formed on the side surface SS of the cover window W or prevent a crack from growing toward the center of the cover window W even when the crack is formed.

In an embodiment in which the cover window W and the frit coating layer FR are made of glass, coefficients of thermal expansion of the cover window W and the frit coating layer FR may be substantially the same. When the coefficients of thermal expansion of the cover window W and the frit coating layer FR are substantially the same, warping of the cover window W and the frit coating layer FR due to a difference between the coefficients of thermal expansion in a thermoforming process to be described below may be prevented.

A planar structure of the cover window W will be described in detail with reference to FIG. 5.

Referring to FIG. 5, in an exemplary embodiment, the side surface SS of the cover window W may include a left side surface SS_L, a right side surface SS_R, an upper side surface SS_T, and a lower side surface SS_B.

The left side surface SS_L and the right side surface SS_R may be arranged at both ends of the curved portion R. Accordingly, the left side surface SS_L and the right side surface SS_R may have a bar shape extending in a longitudinal direction of the display device.

The upper side surface SS_T and the lower side surface SS_B may be respectively arranged at an upper end and a lower end of the flat portion F, and may connect upper ends and lower ends of the left side surface SS_L and the right side surface SS_R. Accordingly, the upper side surface SS_T and the lower side surface SS_B may have an arched or convex cross-sectional shape, as illustrated in FIG. 1.

In an exemplary embodiment, the frit coating layer FR may cover all of the left side surface SS_L, the right side surface SS_R, the upper side surface SS_T, and the lower side surface SS_B.

Light leaking in a direction of the side surface SS may leak to the top, bottom, left, and right sides of the display device. That is, light directed to the side surface SS may pass through any one selected from the left side surface SS_L, the right side surface SS_R, the upper side surface SS_T, and the lower side surface SS_B to cause light leakage.

Therefore, when the frit coating layer FR covers the left side surface SS_L, the right side surface SS_R, the upper side surface SS_T, and the lower side surface SS_B, the visibility of a light leakage phenomenon at the side surface SS may be prevented.

Hereinafter, a display device according to another embodiment of the present disclosure will be described. Some components described below may be substantially the same as those described in the display device according to the exemplary embodiment of the present disclosure described above, and descriptions thereof may be omitted to avoid redundant description.

FIG. 6 is a plan view of the display device according to another embodiment of the present disclosure.

Referring to FIG. 6, a frit coating layer FR1 may be formed only on the left side surface SS_L and the right side surface SS_R.

In this exemplary embodiment in which the frit coating layer FR1 may be formed only on the left side surface SS_L and the right side surface SS_R, most of light generated in the display panel PA is not transmitted to the side surface SS. Light transmission to the side surface SS is particularly prominent in a region in which the curved portion R is formed caused by an incidence angle of light provided by the curved portion R.

That is, even when the frit coating layer FR1 is formed only on an end of the curved portion R, light traveling on the curved portion R may be prevented from passing through the left side surface SS_L and/or the right side surface SS_R.

FIG. 7 is a cross-sectional view of the display device according to another embodiment of the present disclosure. Referring to FIG. 7, a cover window W2 may be flat.

In this exemplary embodiment in which the cover window W2 is flat, a frit coating layer FR2 may also be formed to cover side surfaces SS of the cover window W2.

When the cover window W2 is flat, the display panel PA may also have a flat shape corresponding to the cover window W2.

FIG. 8 is a cross-sectional view of the display device according to another embodiment of the present disclosure. Referring to FIG. 8, a second substrate 290 may be formed on the common electrode 280 of the display panel PA in place of the encapsulation layer 300. In this case, the display panel PA may have rigidity, not flexibility.

The second substrate 290 may be arranged on an opposite side of the first substrate 110. The second substrate 290 may be coupled to the first substrate 110 by a separate sealing member. In an exemplary embodiment, the second substrate 290 may be a transparent insulating substrate. When the second substrate 290 is a transparent insulating substrate, the transparent insulating substrate may be a glass substrate, a quartz substrate, a transparent resin substrate, or the like.

Hereinafter a method of manufacturing a display device according to an exemplary embodiment of the present disclosure will be described. Some components described below may be substantially the same as those described in the display device according to the exemplary embodiment(s) of the present disclosure described above, and descriptions thereof may be omitted to avoid redundant description.

FIGS. 9 to 11 are cross-sectional views for describing an exemplary method of manufacturing the display device according to an exemplary embodiment of the present disclosure.

Referring to FIGS. 9 to 11, the method of manufacturing the display device according to the exemplary embodiment of the present disclosure includes applying a frit onto a side surface of a cover window W, pressing the cover window W with an upper jig 902 and a lower jig 901 and forming a curved portion R, and applying heat to a frit 500 formed on the side surface of the cover window W and forming a frit coating layer FR.

First, referring to FIG. 9, the frit 500 is applied on the side surface SS of the cover window W. The frit 500 may be in a paste or solution state and is not yet cured at this step.

In an exemplary embodiment, the frit 500 may be applied using a screen printing method. Specifically, the frit 500 may be applied in such a manner that the frit 500 in a solution state is printed on the side surface SS of the cover window W.

The frit 500 may be applied to fully cover the side surface SS.

The frit 500 may be applied onto the left side surface SS_L, the right side surface SS_R, the upper side surface SS_T, and the lower side surface SS_B as described in FIG. 5, or may be applied only onto the left side surface SS_L and the right side surface SS_R as described in FIG. 6.

Next, referring to FIG. 10, the cover window W may be arranged between the upper jig 902 and the lower jig 901.

The upper jig 902 and the lower jig 901 may have a shape corresponding to a shape to form the curved portion R of the cover window W. Specifically, the upper jig 902 may have an upwardly concave shape, and the lower jig 901 may have a convex shape corresponding thereto.

Further, a lower surface of the upper jig 902 and an upper surface of the lower jig 901 may include a flat surface to form a flat portion F of the cover window W.

Next, referring to FIG. 11, the upper jig 902 and the lower jig 901 may come close together so that cover window W may be pressed. The upper jig 902 and the lower jig 901 may come close together to press the cover window W. Specifically, the upper jig 902 may be brought into contact with an upper surface US of the cover window W, and the lower jig 901 may be brought into contact with a lower surface BS of the cover window W.

The curved portion R may be formed at both sides of the cover window W due to the shapes of the upper jig 902 and the lower jig 901.

Next, heat is applied to the cover window W. Although described step by step for convenience of description, the applying of the heat to the cover window W may be performed simultaneously with the pressing of the cover window W. In some embodiments, the upper jig 902 and/or the lower jig 901 may be connected to a heating device (not shown). In this case, the upper jig 902 and/or the lower jig 901 may transmit heat to the cover window W in a conductive manner.

A temperature of the heat transmitted to the cover window W may range from 400° C. to 900° C. The upper jig 902 and/or the lower jig 901 may be made of graphite or ceramic to withstand such temperature while maintaining shapes thereof.

The heat applied to the cover window W may serve two purposes. First, the heat applied to the cover window W may at least partially melt the cover window W so that the curved portion R may be formed. That is, the cover window W may be at least partially softened by the applied heat, and thus the curved portion R may be formed by pressing the end portions of the cover window W.

Further, the heat applied to the cover window W may heat and sinter the frit 500. Accordingly, the frit 500 in a paste state or a solution state is cured by the heat.

The heat required to sinter and cure the frit 500 may be obtained from the heat that is used to form the cover window W. That is, as the heat used in the process of forming the cover window W is used to sinter and cure the frit 500, an additional process to form the frit coating layer FR may be avoided. Accordingly, the process may be simplified, and a cost required for the sintering may be reduced.

According to the exemplary embodiments of the present disclosure, light leakage to a side surface of a cover window can be prevented.

Further, pressing and preheating of a cover window can be simultaneously performed so that a process can be simplified.

Effects according to the exemplary embodiments of the present disclosure are not limited by the exemplary embodiments described above, and more various effects are included in the specification.

While the present disclosure has been particularly illustrated and described with reference to exemplary embodiments thereof, it will be understood by those of ordinary skill in the art that various changes in form and detail may be made therein without departing from the spirit and scope of the present disclosure. The exemplary embodiments should be considered in a descriptive sense only and not for purposes of limitation.

What is claimed is:

1. A display device comprising:
   a display panel including a display region and a non-display region that is arranged outside the display region;
   a cover window arranged on the display panel and having an upper surface, a lower surface, and a side surface connecting the upper surface and the lower surface; and
   a frit coating layer covering the side surface of the cover window.

2. The display device of claim 1, wherein the cover window includes a flat portion and a curved portion that is arranged at both sides of the flat portion, the side surface of the cover window includes a left side surface and a right side surface formed at ends of the curved portion, and the frit coating layer is formed on the left side surface and the right side surface.

3. The display device of claim 2, further comprising an upper side surface and a lower side surface configured to connect upper ends and lower ends of the left side surface and the right side surface,
   wherein the frit coating layer is formed on the left side surface, the right side surface, the upper side surface, and the lower side surface.

4. The display device of claim 2, wherein the display panel includes a first substrate, an encapsulation layer formed on the first substrate, and an organic light-emitting diode arranged between the first substrate and the encapsulation layer.

5. The display device of claim 1, wherein a thickness of the frit coating layer ranges from 5 μm to 15 μm.

6. The display device of claim 1, wherein the side surface includes a polished surface chamfered in an oblique direction.

7. The display device of claim 1, further comprising an input sensing unit arranged between the display panel and the cover window.

8. The display device of claim 1, further comprising a polarizing layer arranged between the display panel and the cover window.

9. The display device of claim 1, further comprising a printing layer arranged between the display panel and the cover window.

10. The display device of claim 1, wherein the frit coating layer is black.

11. The display device of claim 1, wherein the cover window is flat.

12. The display device of claim 11, wherein the display panel includes a first substrate, a second substrate opposite to the first substrate, and an organic light-emitting diode arranged between the first substrate and the second substrate.

13. The display device of claim 1, wherein the cover window and the frit coating layer are made of glass.

14. The display device of claim 13, wherein the cover window and the frit coating layer have the same coefficient of thermal expansion.

15. A method of manufacturing a display device, the method comprising:
    applying a frit onto a side surface of a cover window;
    pressing the cover window with an upper jig and a lower jig and forming a curved portion of the cover window; and
    applying heat to the frit and forming a frit coating layer.

16. The method of claim 15, wherein the pressing of the cover window with the upper jig and the lower jig and the applying of the heat to the frit are performed simultaneously.

17. The method of claim 15, wherein a temperature of the heat applied to the fit ranges from 400° C. to 900° C.

18. The method of claim 15, wherein the upper jig and the lower jig include graphite.

19. The method of claim 15, wherein the cover window includes a flat portion and a curved portion that is arranged at both sides of the flat portion, the side surface of the cover window includes a left side surface and a right side surface formed at ends of the curved portion, and the applying of the frit onto the side surface of the cover window includes applying a frit onto the left side surface and the right side surface.

20. The method of claim 15, wherein the applying of the frit onto the side surface of the cover window includes printing the frit in a solution state onto the side surface of the cover window.

* * * * *